United States Patent [19]

Kraybill et al.

[11] 3,863,330

[45] Feb. 4, 1975

[54] SELF-ALIGNED DOUBLE-DIFFUSED MOS DEVICES

[75] Inventors: Albert V. Kraybill, Arlington Heights; William Rapshys, Palatine; Francis R. Yester, Des Plaines, all of Ill.

[73] Assignee: Motorola, Inc., Chicago, Ill.

[22] Filed: Aug. 2, 1973

[21] Appl. No.: 385,139

[52] U.S. Cl. .......................... 29/571, 29/578, 357/23

[51] Int. Cl. .............................................. B01j 17/00

[58] Field of Search ............................... 29/571, 578

[56] References Cited

UNITED STATES PATENTS

| | | | |
|---|---|---|---|
| 3,456,168 | 7/1969 | Tatom | 29/571 |
| 3,685,140 | 8/1972 | Engeler | 29/571 |
| 3,711,940 | 1/1973 | Allison | 29/571 |

*Primary Examiner*—Roy Lake

*Assistant Examiner*—W. Tupman

*Attorney, Agent, or Firm*—Vincent J. Rauner; Charles R. Hoffman

[57] ABSTRACT

A self-aligning masking technique for making double-diffused MOS devices. First and second openings are formed in a first masking layer, and a thin second oxide layer is formed therein. A silicon nitride layer is formed on the first and second masking layers, a third opening defining the source region is formed in the silicon nitride layer adjacent to the first opening, and the exposed first oxide layer is removed. A first region is diffused through the third opening and extends under the thin second oxide layer, and a second, shallower, opposite conductivity region is diffused through the third opening, the channel region being the region between the boundaries of the first and second diffused regions. The thin second masking layer and the overlying silicon nitride layer form a gate insulator for the MOS device, which gate insulator is automatically aligned to the first and second diffused regions.

5 Claims, 12 Drawing Figures

SELF-ALIGNED DOUBLE-DIFFUSED MOS DEVICES

BACKGROUND OF THE INVENTION

Insulated gate field-effect transistors (IGFETs), also commonly referred to as MOS transistors, have established usage in the electronic industry in numerous applications on the basis of several advantageous characteristics, which include simplicity of fabrication, high density in integrated circuit applications, and the resulting low cost per circuit function. Further advantages include circuit design flexibility of MOS circuits due to the very high input impedance and bilateral operating characteristics of MOS transistors. However, the gain, or transconductance, of MOS transistors is much lower than that for bipolar transistors, thereby limiting their use to applications wherein high frequency response at high gain is not required. Primary parameters limiting the high frequency gain of previously available MOS transistors are the channel length and the gate capacitance. In general, the frequency response and gain of any MOS transistor is determined primarily by the channel length and the parasitic gate capacitance, and improves as each of these become smaller in value. Reducing the channel length reduces the transit time for carriers traveling between the source and drain, and reducing the gate capacitance decreases the charging times and the gate to drain feedback. Channel lengths and metal line widths in previous low cost MOS devices have been of the order of ten microns. Reducing these widths has improved the desired performance of such MOS transistors, but only with rapidly increasing cost of manufacture. In order to fabricate MOS transistors with sufficiently high gain and frequency response to be useful for microwave applications, for example, channel lengths of the order of one micron are required. Recently, an improved MOS device, referred to as a double-diffused MOS transistor has been introduced which makes possible fabrication of very short channel lengths, of the order of one micron, without requiring metal line widths of less than eight to ten microns, thereby making it possible to use ordinary photomasking techniques. Further, the device has very high drain to source breakdown voltages, whereas conventionally processed MOS transistors with very short channel lengths exhibit breakdown at rather low drain to source voltages. (Note that the invention in this patent application regards self-alignment between the gate electrode and the channel diffusion, not self-alignment between the channel diffusion and the source diffusion.) However, the double-diffused MOS devices available up to the present time nevertheless require very stringent alignment steps, because a difficulty arises when the thin gate oxide insulator is aligned with respect to the opening in the diffusion mask used for forming the source region and the channel region. A misalignment of the gate oxide severely degrades the device performance at high frequencies by increasing the gate to source and gate to drain overlap capacitances.

The present invention solves these difficulties by providing double-diffused MOS devices in which the gate electrode is self-aligned to the channel region.

SUMMARY OF THE INVENTION

In view of the foregoing considerations, it is an object of this invention to provide a semiconductor device having self-aligned diffused regions therein.

It is another object of the invention to provide double-diffused MOS devices having a gate insulator self-aligned to the channel region.

It is another object of the invention to provide a method for fabricating semiconductor devices of the type described.

Briefly described, the invention provides a self-aligned double-diffused MOS device fabricated by forming a thick oxide on a lightly doped substrate, forming first and second openings in the oxide layer, and forming a thin oxide layer at the bottom of said openings. A silicon nitride layer is deposited on the wafer surface, a third opening is formed therein to define the channel region, and the exposed oxide is then removed. The source region is diffused through the third opening, with the nitride over the thin oxide acting as a diffusion mask therefor. An opening defining the drain contact region is formed in the nitride over the second opening, and the thin oxide therein is removed. The source and drain regions are simultaneously diffused, the nitride over the thin oxide in the first first opening acting as a diffusion mask. The thin oxide in the first opening and the nitride thereon form a gate insulator. The source diffusion is shallower than the first region, and since the first and second diffused regions are both masked by the same nitride mask, which also is part of the gate insulator, in the first opening, the first and second diffused regions are self-aligned, and precise control of the channel width is achieved, and the gate is automatically aligned to the channel region, so that the gate-to-source capacitance may be precisely controlled.

DESCRIPTION OF THE INVENTION

Figure 1:
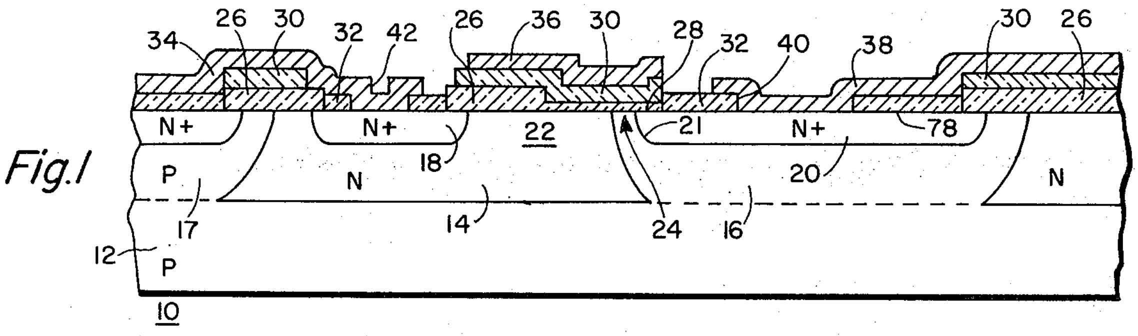
FIG. 1 is a cross-sectional diagram of a preferred embodiment of the invention.

FIG. 1 is a cross-sectional diagram of a semiconductor device including a self-aligned double-diffused MOS transistor fabricated according to the present invention. Semiconductor device 10 includes a P-type region 12 which serves as a substrate for the device 10. N-type region 14 forms a PN junction with P-type region 12, and P-type region 16 and P-type region 17 form PP junctions with substrate 12 as indicated by the dotted lines. Heavily doped N-type region 20 is formed within P-type region 16, forming PN junction 21 therewith, and heavily doped N-type region 18 is formed within N-type region 14. Thus, elongated P-type region 16 is formed between N-type region 20 and regions 12 and 14. N-type region 20 forms the source of a double-diffused MOS transistor; N-type region 18 forms the drain contact region, and the surface portion of elongated P-type region 16 forms a channel region 24 of the double-diffused MOS transistor. The surface region of N-type region 14 forms a drift region 22 for the transistor. The gate insulator is formed by the combination of thin oxide layer 28 and the portion of silicon nitride layer 30 thereon. Metal region 36 on the exposed surface of silicon nitride layer 30 forms the gate electrode. Thick oxide layer 26 is formed on the upper surface 78 of the body of semiconductor, adjacent and contiguous with thin oxide layer 28. Thick oxide layer 26 has several relatively thin portions 32 thereof over N-type regions 18 and 20, respectively, which thin portions have openings 40 and 42 therein which expose, respectively, N-type regions 20 and 18. Metal layer 34 forms a drain electrode contacting region 18 through opening 42, and metal layer 38 forms a source electrode, contacting source region 20 through opening 40. It will be recognized that the diagrams in the Figures are not drawn to scale, and that the gate insulator formed by thin oxide layer 28 and nitride layer 30 may have a combined thickness of approximately 1000 angstroms, while the thicknesses of oxide layer 26 and portions 32 thereof may be substantially greater than 1000 angstroms in thickness.

The substructure of the semiconductor device 10 including the diffused source, drain, and channel regions as shown in FIG. 1 are described in "Double-Diffused MOS transistor Achieves Microwave Gain" by T. P. Cauge, J. Kocsis, H. J. Sigg and G. D. Vendelin in Electronics, Feb. 15, 1971, pp. 99–104. However, the insulator and dielectric structure illustrated in FIG. 1 is different than that in the above-mentioned article, as a result of the improved method of fabricating a double-diffused MOS transistor according to the present invention.

Figure 2:
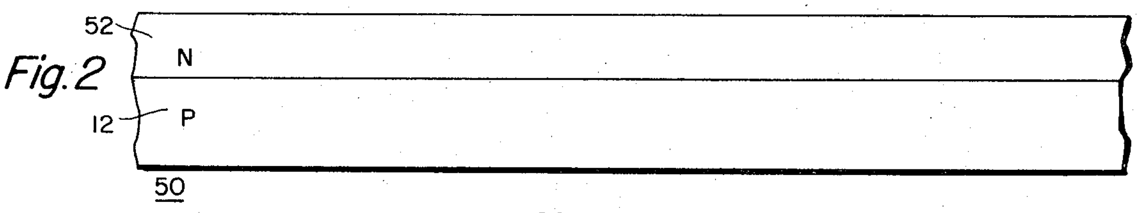
FIGS. 2 – 8 are cross-sectional diagrams illustrating a method of manufacturing the embodiment illustrated in FIG. 1.
Figure 3:
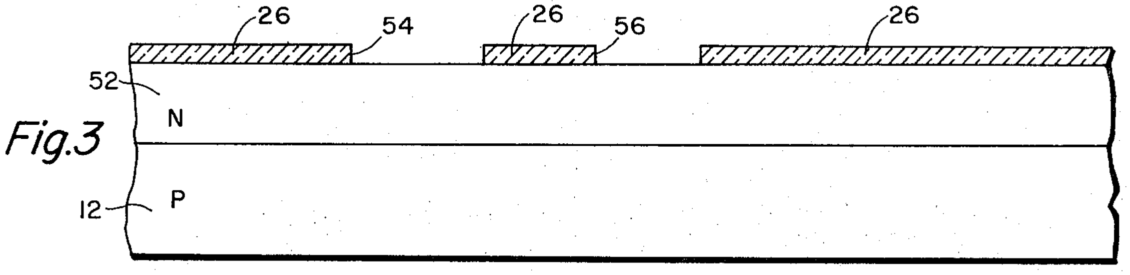

FIG. 2 depicts the starting body of material 50, which includes an N-type layer 52 on P-type layer 12. It should be noted that the corresponding reference numerals of FIG. 1 are utilized in the following description of the manufacturing method. Referring to FIG. 2, the resistivity of substrate 12 may be 10 ohm centimeters and the resistivity of layer 52 may be 10 ohm centimeters. The first step in the operation, after appropriate cleaning procedures, is to form oxide layer 26 on the exposed surface of region 52, and to etch openings 54 and 56 therein, as shown in FIG. 3. Oxide layer 26 may, for example, be thermally grown silicon dioxide approximately 4000 angstroms in thickness, or it may be deposited in a controlled vapor deposition apparatus. Conventional photolithographic techniques may be used to form openings 54 and 56.

Figure 4:
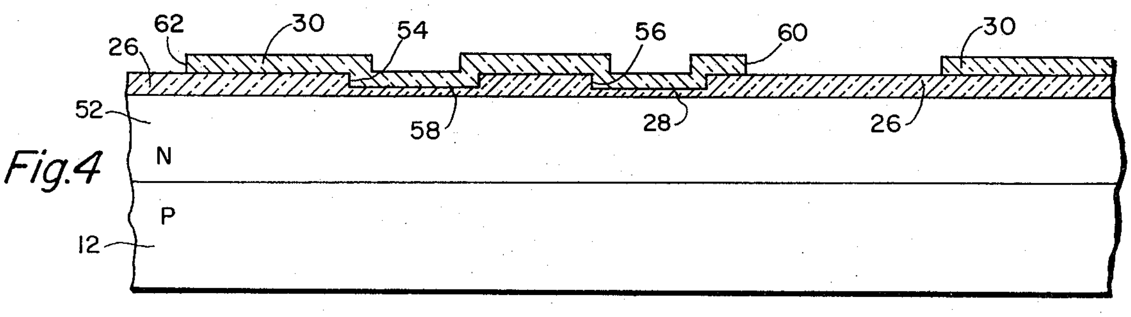

The next step is to thermally grow a thin silicon dioxide layer on the exposed portion of N-type layer 52 in openings 54 and 56, as indicated by reference numerals 28 and 58 in FIG. 4. Oxide layers 28 and 58 may, for example, be approximately 100 angstroms in thickness. The next step is to deposit silicon nitride layer 30 on the oxide layers, which nitride layer 30 may be approximately 1000 angstroms thick. Utilizing conventional photolithographic techniques, opening 60 is etched in nitride layer 30, exposing a portion of oxide layer 26. The structure at this point is illustrated in FIG. 4.

Figure 5:
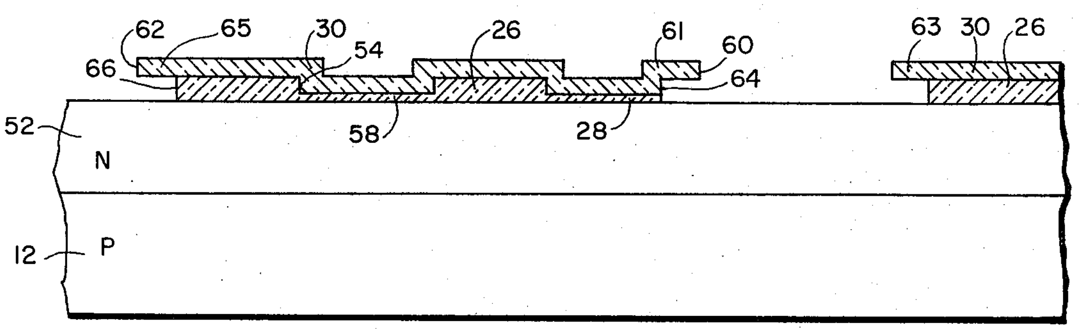

The wafer is then subjected to an etchant to remove the exposed portion of silicon dioxide layer 26, silicon nitride layer 30 acting as a mask against the etchant. The etchant undercuts the nitride layer 30 to boundary 64 as it etches through openings 60 and 62, causing nitride lips 61 and 63 to be formed at the perimeter of opening 60 and a second nitride lip 65 to be formed at the perimeter of opening 62. However, the etching step is controlled such that significant undercutting of the thin oxide layer 28 does not occur. The resulting structure is shown in the cross-sectional diagram in FIG. 5, wherein boundary 64 defines the subsequently formed channel and source regions.

Figure 6:
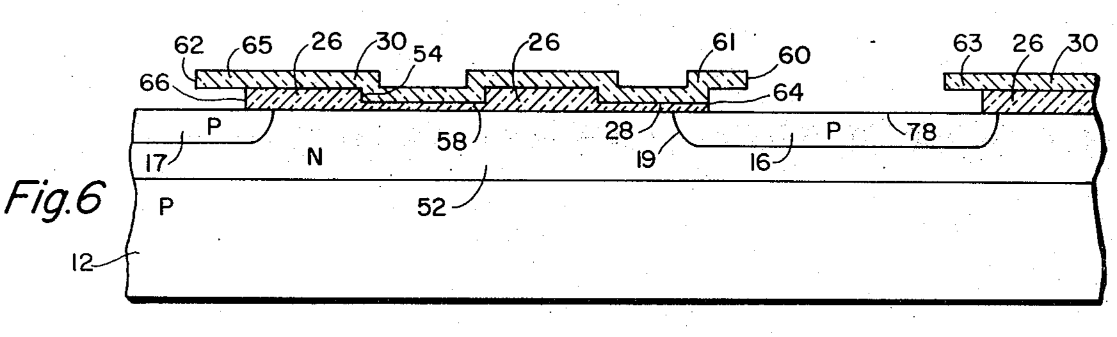

Next, the structure is exposed to a P-type dopant which diffuses through openings 60 and 62, silicon nitride layer 30 acting as a diffusion mask. The boundaries 64 and 66 delimit the P-type regions 16 and 17 formed thereby, which extend, at this point, partly through N-type layer 52. P-type region 16 forms a PN junction 19 with N-type region 52. The structure at this point in the manufacturing operation is shown in FIG. 6. It should be noted that the junction depth of region 16 (and also region 17) at this point is relatively small, especially if the P-type dopant is boron, so that junction 19 extends a first predetermined distance under nitride insulator 30. This is necessary because during subsequent heating the junction 19 will move outward and downward as the P-type impurities are driven in further.

Figure 7A:
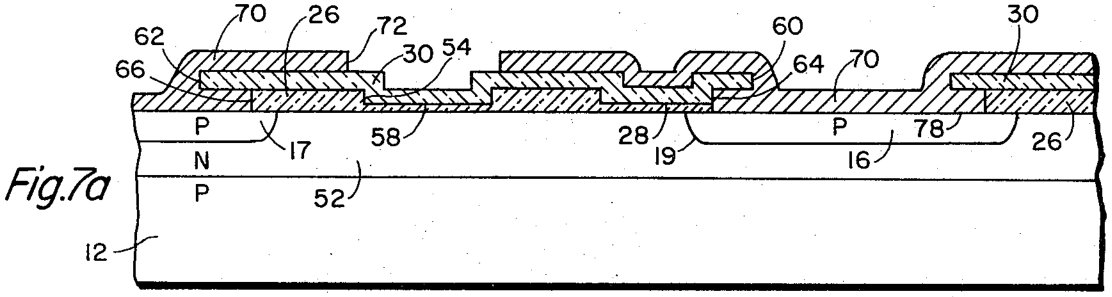
Figure 7B:
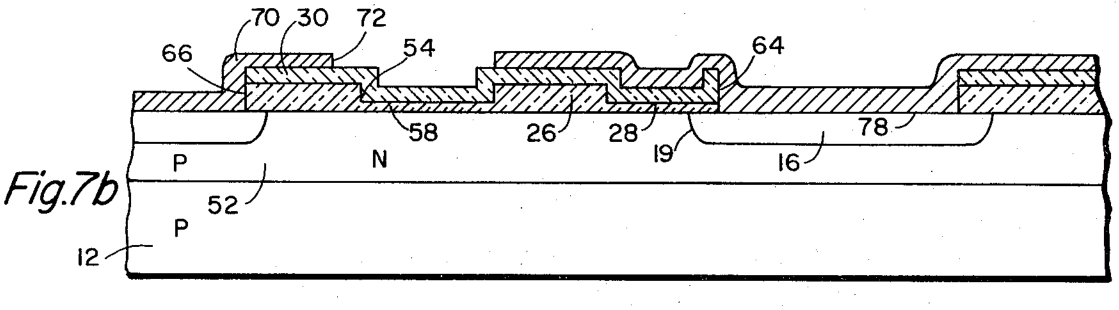

A photoresist layer 70 may then be applied to the upper surface of the structure as shown in FIG. 7*a* and an opening 72 circumscribing opening 54 in oxide layer 26 may be formed. The structure than appears as shown in FIG. 7*a;* however, if it is necessary that nitride lips 61, 63 and 65 be removed, an alternative method may be utilized to obtain the structure of FIG. 7*b*.

If nitride layer 30 is initially deposited at twice the required thickness, then the wafer as shown in FIG. 6 may be subjected to a nitride etchant which does not attack silicon. The etchant will then etch from both the upper surface and the under surface of the nitride lips 61, 63, and 65. When the etching process has progressed to the point where the nitride lips are removed, the silicon nitride masking layer 30 will be reduced to approximately one-half of its original thickness. The photoresist layer 70 may then be applied to the upper surface of the wafer and aperture 72 is then provided therein to produce the device shown in FIG. 7*b*.

Next, the wafer is subjected to a nitride etchant which removes the exposed portion of silicon nitride layer 30, exposing the underlying portions of oxide layer 26 and thin oxide layer 58. Subjecting the wafer to an oxide etchant then quickly removes a thin oxide layer 58, exposing the surface of N-type region 14. A photoresist layer 70 may be removed either before or after the oxide etching step. Opening 54 then defines the subsequently formed drain region, and boundary 64 defines the source region.

Figure 8:
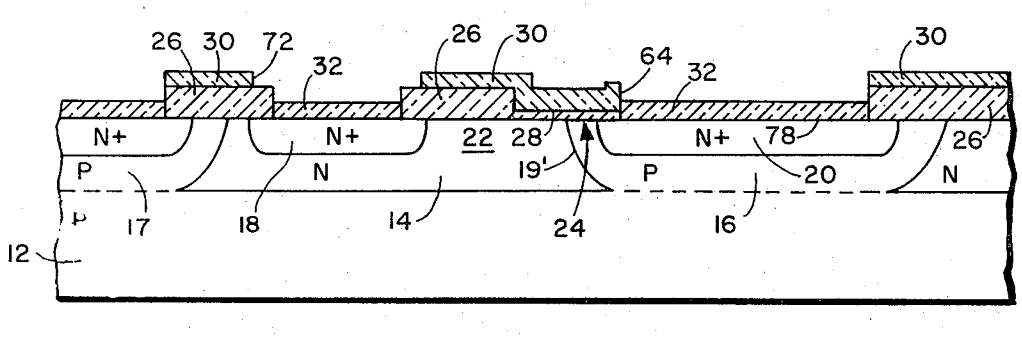

Next, the wafer is subjected at high temperatures to an N-type dopant, and source region 20 and drain region 18 are diffused into P-type region 16 and N-type region 14, respectively. As the N-type dopant, which may be phosphorous, is diffused to form $N^+$ regions 18 and 20, which extend a second predetermined distance under nitride insulator 30, P-type region 16 is driven in deeper, as indicated in FIG. 8 by reference numeral 19′, to extend a third predetermined distance under nitride insulator 30, and to isolate region 14 of layer 52. According to the invention, N-type source region 20 advantageously is very shallow, and sufficiently deep to ensure that the inversion region formed in the channel region 24 (when a gate to source voltage exceeding the threshold voltage is applied) contacts N-type source region 20, thereby providing reliable operation of the double-diffused MOSFET device. The gate to source capacitance is thereby minimized. The junction depth of the original junction 19 of region 16 may be chosen so that at the completion of the diffusion of N-type region 20, junction 19′ is approximately one micron deeper than region 20. The resulting double-diffused MOS device will then have very high gain due to the short length, approximately one micron of channel 24 and will further have excellent high frequency performance due to the low gate to source overlap capacitance. During or after the above-described N-type diffusion process, oxide layers 32 may be thermally grown on the exposed portions of source region 20 and drain contact region 18. Precise control of the channel length characteristic of double-diffused MOS devices is achieved because the N-type diffusion is diffused through the same diffusion mask boundary 64 as channel region 16.

It is clear that the advantages of the device according to the present invention are achieved by utilization of the gate insulator, which includes thin oxide layer 28 and the overlying portion of nitride layer 30, as the diffusion mask for the channel and source diffusions, so that the gate to source overlap is precisely controlled to the desired tolerance, thereby making it possible to reduce the gate source overlap capacitance of the MOS transistor. The final steps in manufacturing the device are illustrated in FIG. 1, previously described, and include etching openings 42 and 40 in oxide layer 32 to expose the surfaces of drain region 18 and source region 20, respectively. A metal layer is then provided on the upper surface of the structure, utilizing conventional methods such as vacuum evaporation. The metal layer is then patterned using conventional photolithographic techniques to provide drain electrode 34, which contacts region 18 through opening 42, and gate electrode 36, and source electrode 38, which contacts source region 20 through opening 40.

Figure 9:
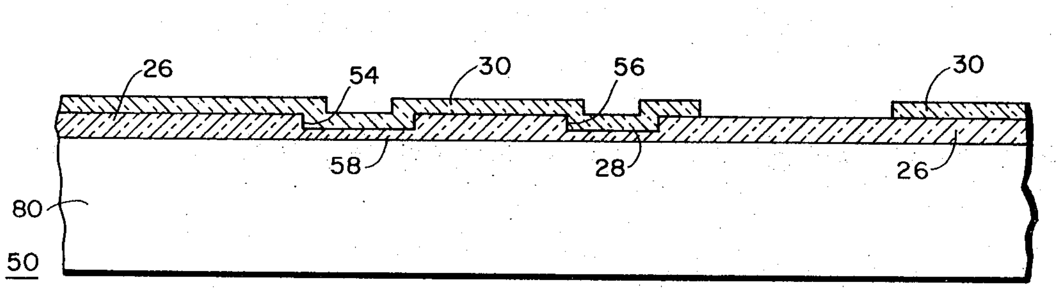
FIGS. 9 – 11 are cross-sectional diagrams illustrating a method of manufacturing another embodiment of the invention.
Figure 10:
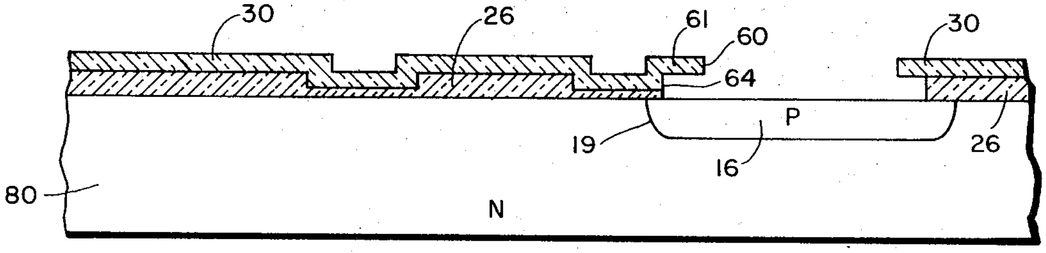
Figure 11:
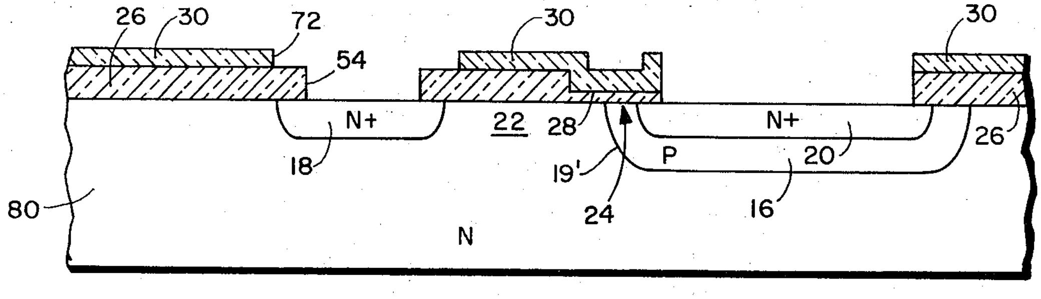

FIGS. 9–11 illustrate the method of the invention applied to a different body of starting material. Referring to FIG. 9, semiconductor body 50 consists of a single substrate 80 of N-type material. Oxide layers 26, apertures 54 and 56, and thin oxide layers 28 and 58 are formed exactly as described earlier with reference to FIGS. 3 and 4. Also, silicon nitride layer 30 and aperture 60 therein are formed as previously described with reference to FIG. 4; note, however, that opening 62 in silicon nitride layer 30 of FIG. 4 is omitted in the structure shown in FIG. 9. This is because the opening 62 was utilized to define an additional P-type region 17 (see FIG. 6) for isolating N-type region 14. However, in the embodiment of the invention described in reference to FIGS. 9 – 11, it is not possible to obtain an isolated drain region and drift region.

Referring to FIG. 10, the exposed oxide is removed utilizing an etchant which is masked by silicon nitride layer 30 to expose the surface of N-type region 80. The nitride layer is undercut to produce a nitride lip 61 and a nitride boundary 64, as previously described in relation to FIG. 6. The wafer is then subjected to diffusion from a P-type dopant source to form P-type region 16, which forms a PN junction 19 with N-type substrate 80. Again, referring to FIG. 11, identical processing steps have been utilized as previously described in relation to FIG. **7*b* and FIG. 8 to obtain the structure illustrated in FIG. 11, wherein the nitride lip 61 has been removed by a nitride etchant and openings 72 and 54 have been formed, respectively, in nitride layer 30 and in oxide layer 26. N-type source region 20 and N-type drain region 18 are then formed by diffusion to form the surface channel region 24. Subsequent oxidation and metallization steps provide a structure similar to that of FIG. 1, except that the drain region 18 and the drift region 22** are not isolated.

It will be recognized by those skilled in the art that the second embodiment described herein may be more applicable to manufacture of discrete double-diffused MOS devices, while the method of the first embodiment of the invention may be utilized to provide double-diffused MOS transistors in an integrated circuit.

Clearly, several options are available for modifying the processing steps as described. For example, the opening 60 which defines the P-type region 16 may be made sufficiently large that a bonding pad may be subsequently formed therein. Further, the nitride lip 61 may be dealt with by thermally growing or depositing an oxide after the N-type diffusion step to fill up the space under the lip.

The self-aligning masking techniques of the invention may also be used to fabricate conventional MOSFET devices. For example, a silicon dioxide layer could be provided on a P-type substrate, and an opening substantially defining the gate region could be etched therein. Then silicon nitride could be deposited over the exposed surface, and then patterned to substantially define the source and drain regions. The exposed $sIO_2$ could then be etched away, leaving nitride lips as previously described. The $N^+$ source and drain regions could then be diffused, using the nitride as a diffusion mask, and thus would be self-aligned to the nitride gate electrode.

In summary, the present invention provides a method of making double-diffused MOS transistors wherein the combination of the silicon dioxide and silicon nitride insulating layers are provided in such a manner that silicon nitride acts both as a gate insulator formed prior to any of the diffusion steps and subsequently acts as a diffusion mask so that the gate electrode is automatically aligned to the source region. Thus, the gate to source overlap capacitance may be precisely reduced.

Although the present invention has been described with reference to several preferred embodiments thereof, those skilled in the art will recognize that the placement of parts and order of manufacturing steps described herein are merely exemplary, and variations to suit specific requirements may be made within the scope of the invention.

What is claimed is:

1. A method of making a double-diffused MOSFET semiconductor device comprising the steps of:

forming a first insulating layer on a first surface of a substrate of semiconductor;

forming a first opening in said first insulator exposing said substrate;

forming a second insulating layer on said first insulating layer and on said exposed substrate;

forming a second opening in said second insulating layer, exposing said first insulating layer;

removing said exposed first insulating layer, exposing said first surface;

forming a first region in said substrate through said second opening, said first region being of a first conductivity type, and extending a first predetermined distance under said second insulating layer in said first layer;

forming a third opening in said first and second insulating layers, exposing said substrate;

forming second and third regions of a second conductivity type in said substrate at said first surface, said second region being formed in said first region through said second opening and extending a second predetermined distance under said second insulating layer, said first region being driven in further to extend a third predetermined distance under said second insulating layer, said second predetermined distance being less than said third predetermiend distance, and said third region being formed external to said first region through said third opening; and forming a conductive gate electrode on said second insulating layer over said first opening, said second predetermined distance being selected to minimize the capacitance between said conductive gate electrode and said second region while providing reliable operation of said double-diffused MOSFET devices, said third predetermined distance being selected to provide an optimized channel length.

2. The method as recited in claim 1 wherein said first insulator is silicon dioxide and said second insulator is silicon nitride.

3. The method as recited in claim 2 further including the step of forming thermally grown silicon dioxide layers on said exposed substrate in said first opening after forming said first opening and before forming said second insulating layer, said thermally grown silicon dioxide layer being substantially thinner than said first insulating layer.

4. The method as recited in claim 2 wherein said substrate includes a layer of a second conductivity type on a body of semiconductor, of said first conductivity type, said first surface being on said layer of said second conductivity type, and said first region extends through said layer to said body of semiconductor after the forming of said second and third regions.

5. The method as recited in claim 2 wherein said silicon nitride insulator is subjected to a controlled etching process to remove a nitride lip after forming said first region and before forming said third opening.

* * * * *